United States Patent [19]

Cybela

[11] Patent Number: 4,874,960
[45] Date of Patent: Oct. 17, 1989

[54] PROGRAMMABLE CONTROLLER CAPACITOR AND BATTERY BACKED RAM MEMORY BOARD

[75] Inventor: Jeffrey J. Cybela, Glendale, Wis.
[73] Assignee: Square D Company, Palatine, Ill.
[21] Appl. No.: 164,148
[22] Filed: Mar. 4, 1988
[51] Int. Cl.$^4$ .......................... H02J 9/02; G11C 11/34
[52] U.S. Cl. ......................................... 307/64; 307/66; 365/228; 365/229
[58] Field of Search ..................... 307/64, 66, 85, 86, 307/87; 365/226, 227, 228, 229

[56] References Cited

U.S. PATENT DOCUMENTS

| | | | |
|---|---|---|---|
| 3,859,638 | 1/1975 | Hume | 365/229 |
| 4,223,395 | 9/1980 | Sakaguchi et al. | 365/229 |
| 4,227,257 | 10/1980 | Sato | 365/229 X |
| 4,232,377 | 11/1980 | Tallman | 365/229 |
| 4,247,913 | 1/1981 | Hiniker et al. | 365/228 |
| 4,301,540 | 11/1981 | Sato et al. | 365/228 X |
| 4,534,018 | 8/1985 | Eckert et al. | 365/228 |
| 4,591,782 | 5/1986 | Germer | 365/228 X |
| 4,611,302 | 9/1986 | Bockett-Pugh | 365/228 X |
| 4,646,132 | 2/1987 | Kuwabara et al. | 365/226 X |
| 4,672,585 | 6/1987 | Nollet | 365/228 |
| 4,713,555 | 12/1987 | Lee | 365/229 X |
| 4,730,121 | 3/1988 | Lee et al. | 365/229 X |

FOREIGN PATENT DOCUMENTS

| | | | |
|---|---|---|---|
| 0033435 | 3/1977 | Japan | 365/228 |
| 0026390 | 2/1983 | Japan | 365/228 |

*Primary Examiner*—William M. Shoop, Jr.
*Assistant Examiner*—Paul Ip
*Attorney, Agent, or Firm*—Michael J. Femal

[57] ABSTRACT

A switching network on a volatile memory circuit card assembly includes a back-up battery power supply to supply power to the volatile memory components upon failure of a line source of electrical power. A high capacitance capacitor acts as a power source to supply power to the memory components upon failure of the line source of power and before tha back-up battery power supply acts. This substantially increases the life of the battery. The switching network also provides a switch normally conducting the line source electrical power to the memory components and that isolates the memory components from the line source electrical power supply upon a failure. Switches also isolate a WRITE signal form the memory components and produce a PROTECT signal with a hysteresis effect. A second battery located off the card assembly can act to supply power before the first battery on the card assembly.

8 Claims, 2 Drawing Sheets

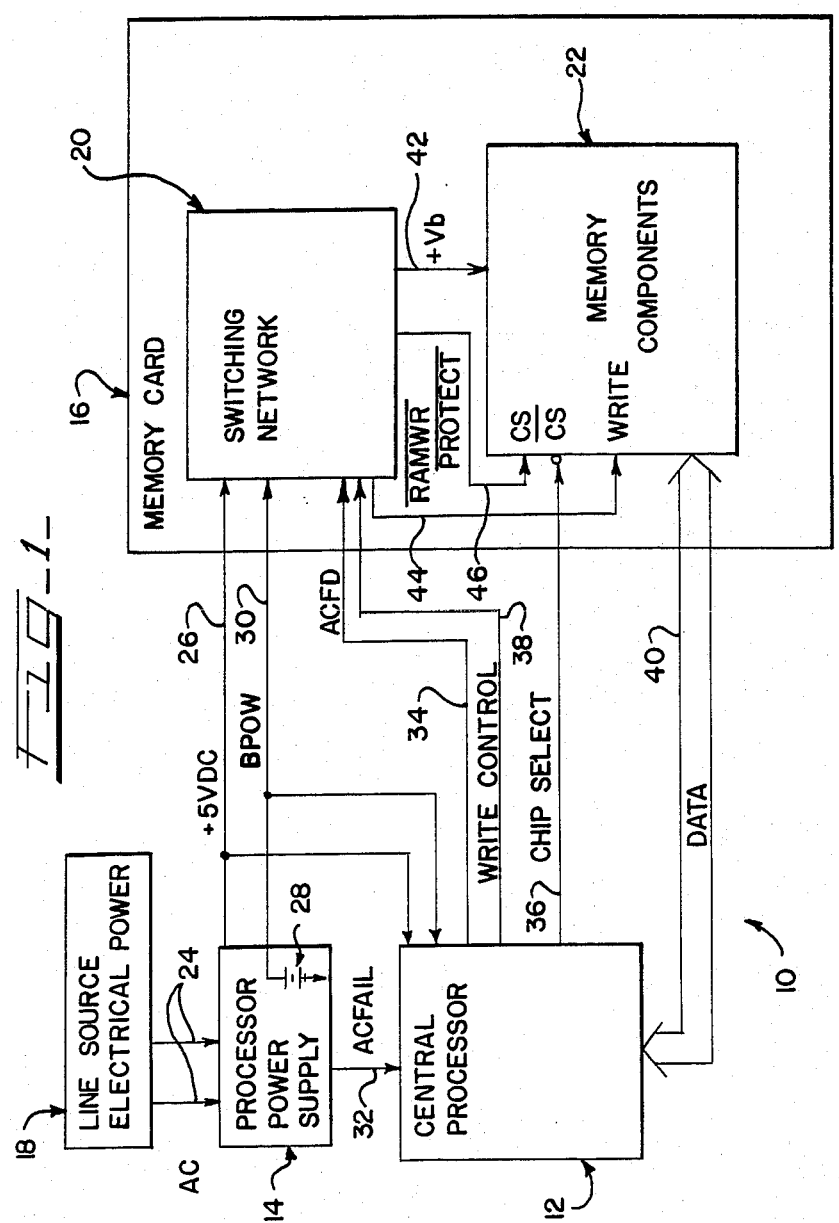

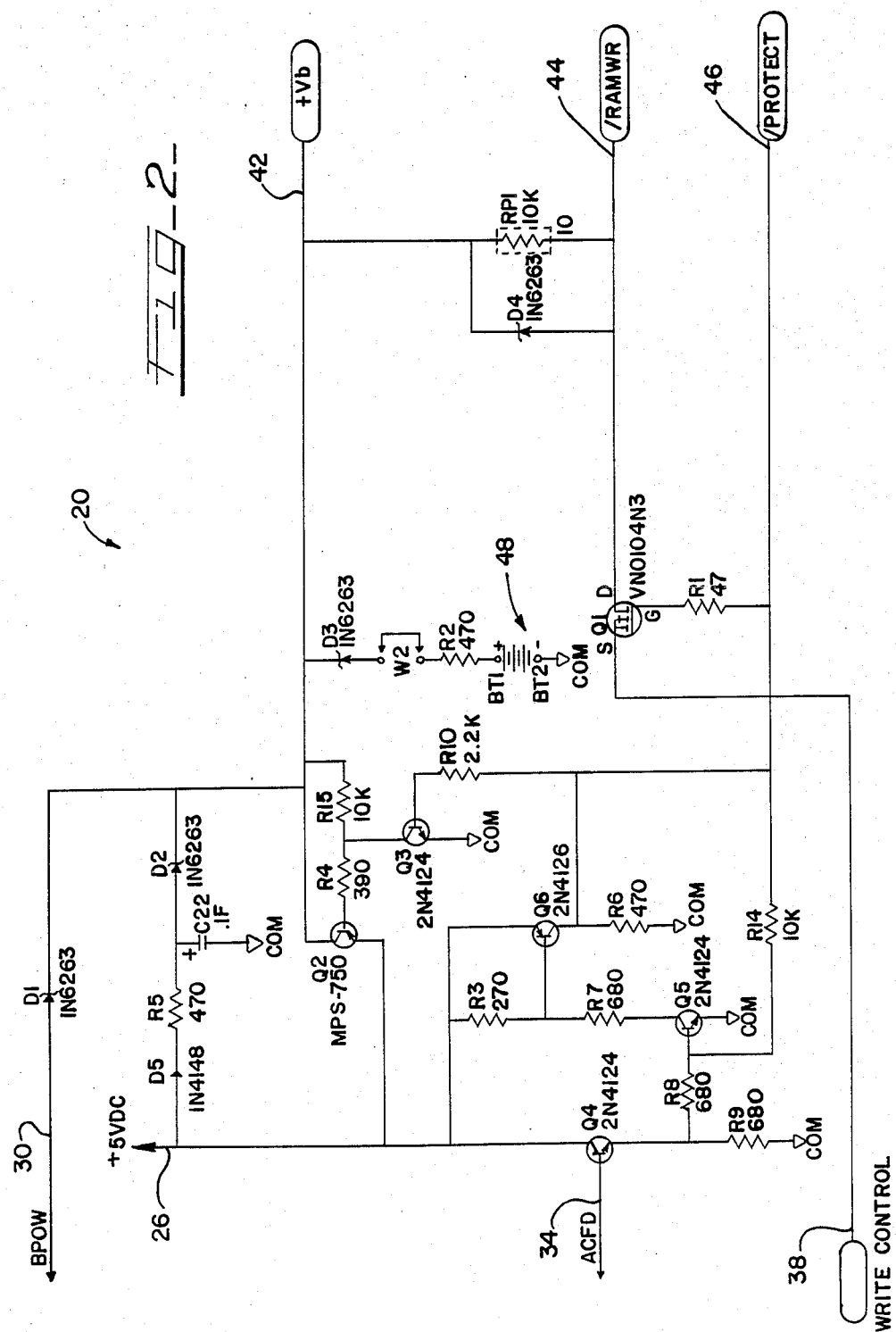

PROGRAMMABLE CONTROLLER CAPACITOR AND BATTERY BACKED RAM MEMORY BOARD

BACKGROUND OF THE INVENTION

This invention relates generally to maintaining a supply of electrical power to electronic components normally furnished from a line supply of electrical power, and particularly relates to maintaining said electrical power to volatile memory components at the occurrence of and during a loss of said line electrical power.

Volatile memory components must receive electrical power continuously to maintain the information stored in their memory cells. Upon loss of electrical power, the states of the memory cells become indeterminate, and any desired information states, such as a logical 1 or a logical 0 at selected addresses, become lost. If the information stored in these volatile memory components is duplicated in non-volatile memory devices, such as a magnetic disk or in a magnetic bubble pack, a loss of electrical power is not catastrophic and is within acceptable operation. Not all central processor systems however use a magnetic disk or bubble memory pack to retain information.

Some volatile memory components such as CMOS (complimentary metal oxide silicon) RAM (random access memory) components operate at extremely low power levels from a 5 volt supply. These CMOS RAM components retain their stored information for extended periods with an extremely low current from the supply; removing the supply current however results in loss of the stored information. A small battery, which supplies about 3.6 volts, carried on a circuit card assembly also carrying the CMOS RAM components can maintain a supply of electrical power during a loss of line source electrical power or during removal of the card from the enclosure of the associated central processor to retain the information in the CMOS RAM components. In this arrangement, the battery is substantially the sole source of back-up power and any by-pass or filter capacitors are intended to source or supply little or no current or voltage.

Other arrangements include a high-capacitance capacitor mounted on the circuit card assembly to maintain some power to the volatile memory components at loss of line source electrical power. In these arrangements, the line source supply charges the capacitor to the nominal 5 volts from the supply and upon failure of the line source, the capacitor supplies power to the memory components. Usually, no battery is present.

Depending on temperature, a battery typically can supply electrical power to the volatile components for several years, while a high capacitance capacitor typically can supply electrical power for many hours.

The switchover from line source electrical power to battery- or capacitor-backed electrical power must be performed cleanly to avoid introducing electrical noise into the electrical power supplied to the volatile memory components. Electrical noise in the supply to the memory components can deleteriously affect the contents of the memory cells to change the stored logical states. Some of these prior arrangements have included standard diodes that exhibit a nominal 0.7 volt forward voltage drop. These diodes prevent reverse bias of the battery during normal line source operation and conduct electrical power from the battery to the memory components during loss of the line source. The 0.7 volt drop across the standard diode, however, reduces by that amount the typical 3.6 volts of electrical power normally available from the battery for supplying the memory components.

Typically, the central processor or power supply for the central processor can determine the loss of the line source electrical power and provide for an orderly end of the processing of information.

While the use of battery-backed memory card assemblies have furnished a good alternative to non-volatile memory systems, there are some drawbacks associated with them. For example, a battery has a best case shelf life of 6–7 years, which is substantially less than the expected 20–30 years life of the components in associated central processor. This requires that the battery must be replaced at a worst case intervals of every few years to guarantee the integrity of the stored information. Skilled labor must replace the battery and a higher paid manager must keep proper records to insure that the skilled laborer changes the battery at a proper time. These labor costs increase with many battery-backed card assemblies distributed through out a large manufacturing plant. Additionally, special care must be taken to design the central processor cabinet and the circuit card assembly for easy access in changing the battery.

The major event that reduces the battery's shelf life is a frequent and short term supplying of power to the memory components. This often occurs upon momentary failure of line power and upon removing power from the central processor to service a controlled device, to service the central processor and to repair or replace associated equipment. These occurrences usually last from a moment to an hour and have simply been accepted as normal operating conditions that become accounted in determining the replacement interval for the battery.

SUMMARY OF THE INVENTION

The invention furnishes a power supply back-up arrangement that substantially increases the life of a back-up battery, nominally supplying 3.6 volts, on a circuit card assembly including volatile memory components. The short term draw of power from the back-up battery is eliminated by additionally furnishing on the card assembly a high-capacitance capacitor that normally becomes charged to the nominal 5 volts from the line supply; the higher voltage on the capacitor supplies power to the memory components for up to several hours. Not until the voltage on the capacitor decays to about that of the battery, does the back-up battery begin supplying power to the memory components.

A switching network, which includes the back-up battery and capacitor supplies, on the circuit card assembly operates cleanly to switch from the line source of electrical power to the battery and capacitor sources of electrical power. The switching network further operates to prevent further writing of information into the memory components and to de-select the memory components. The switching network also connects a second battery source of power, supplying 4.5 volts nominal and located in the central processor power module, to the battery and capacitor sources of power upon a power loss. The second battery source of power will act to supply power to the memory components as the voltage on the capacitor decreases to about 4.5 volts and, when the card assembly is connected in the central processor, will supply power before the back-up battery on the card assembly, further increasing the life of the battery on the card assembly.

In particular, the switching network includes bi-polar transistors that receive an ACFAIL signal from the central processor to switch off the +5 volt DC electrical power to the memory components and to effect desired protections against chip selection and write control of those memory components.

The arrangements of the invention provide extended life for the battery carried on the card assembly and an orderly transfer of power between the line source of electrical power and the back-up sources. This transfer occurs cleanly and without noise being introduced into the power supplied to the memory components. The achievements of the invention include reduced labor costs to replace the card mounted battery.

BRIEF DESCRIPTION OF THE DRAWINGS

FIG. 1 is a block diagram of a central processor having a memory card that includes the switching network of the invention; and FIG. 2 is a schematic diagram of the switching network of the invention.

DESCRIPTION OF THE PREFERRED EMBODIMENT

In FIG. 1, general purpose processor 10 comprises central processor 12, power supply 14 and memory card 16. Processor 10 receives electrical power from line source 18 which can be such as a wall receptacle or junction panel terminals. Memory card 16 includes switching network 20 and memory components 22, which are such as CMOS RAM integrated circuits connected in any desired array. The memory components 22 typically require some chip select signal (CS) or signals (CS and /CS) and require a write command signal (WRITE) to effect writing of data into the memory cells of each integrated circuit.

It is to be understood that the signals depicted in FIG. 1 illustrate the applicable parts of a general purpose processor connected to the switching network of the invention and do not define all parts of the general purpose processor 10. It also will be understood that a slash "/" preceding the name of a signal indicates a negative active state of that signal.

Processor power supply 14 receives the line source electrical power over leads 24 and produces a nominal +5 volts DC on line 26 to both the switching network 20 and the central processor 12. The processor power supply also includes a battery 28 available to supply backplane power (BPOW) at a nominal of 4.5 volts on line 30 to both the switching network 20 and the central processor 12 as required. Central processor 12 receives from the processor power supply a signal named ACFAIL on line 32 that indicates the imminent loss of the line source electrical power 18. Central processor 12 produces a signal ACFD on line 34 to at the least the switching network 20 in response to receipt of the AC-FAIL signal on line 32. Central processor 12 also produces a CHIP SELECT signal on line 36 and a WRITE CONTROL signal on line 38 to move data from the central processor 12 over lines 40 to the memory components 22. It will be understood that data also travels from memory components 22 to the central processor 12 in response to suitable control signals, not depicted.

Switching network 20 normally conveys +Vb electrical power to the memory components over lead 42. In response to the ACFD signal and the loss of line source electrical power, switching network 20 also produces a /RAMWR signal on lead 44 that inhibits or prevents operation of the WRITE signal at the memory components, and also produces a /PROTECT signal on lead 46 to prevent selection of the memory components. This protects the memory components 22 from writing erroneous data signals into their memory cells shortly after the loss of regular line source electrical power.

In FIG. 2, switching network 20 receives +5 volts DC on lead 26 and normally conducts that electrical power through transistor Q2 to +Vb on lead 42. In one particular embodiment, transistor Q2, a PNP transistor, typically conducts 100-200 milliamps to the memory components. The ACFD signal on line 34 normally remains high during the presence of the line source electrical power 18. This makes NPN transistor Q4 conductive, makes NPN transistor Q5 conductive, makes PNP transistor Q6 conductive, makes NPN transistor Q3 conductive and maintains PNP transistor Q2 conductive. A transistor being conductive means that electrical current flows through it either from the collector to emitter or from the emitter to collector. Transistor Q6 being conductive causes DMOS FET transistor Q1 to be conductive and conducts from its source S and to its drain D the WRITE CONTROL signal from lead 38 to the /RAMWR signal on lead 44. Transistor Q6 being conductive also applies the +5 volts DC from lead 26 to the /PROTECT signal on lead 46. In normal operation, the switching network 22 conveys +5 volt DC electrical power to the memory components on lead 42, conveys the WRITE signal from lead 38 to make the /RAMWR signal on lead 44, and maintains the /PROTECT signal on lead 46 at a logical high of the +5 volt source.

Upon the ACFD signal on line 34 going low, transistors Q4, Q5 and Q6 become non-conductive, and the /PROTECT signal on line 46 approaches ground through a resistor R6. This makes transistor Q3 non-conductive and renders transistor Q2 non-conductive in a manner to be described presently. Capacitor C22, a 0.1 farad capacitor normally charged by the 5 volt supply to 5 volts, will supply back-up electrical power when its voltage is greater than that available from other sources. Diode D5 and resistor R5 normally direct charging current to capacitor C22. Diode D5 prevents discharge of the capacitor C22 back into the line source when the +5 volt DC power fails; resistor R5 limits charging current to the capacitor when the circuit is initially powered up and the voltage across capacitor C22 is zero. Schottky diode D2, which nominally has a forward voltage drop of 0.2 or 0.3 volts, connects capacitor C22 to the +Vb line 42 and also prevents the +Vb voltage from charging the capacitor 22. This prevents any back-up battery power from charging the capacitor C22. At least the charge stored on capacitor C22 supplies power through resistors R13 and R4 to the base of transistor Q2 to render transistor Q2 non-conductive when transistor Q3 is rendered non-conductive.

At this point in time the line supplied +5 volt DC electrical power will abate, and opening the switch represented by transistor Q2 removes the +Vb electrical power supply line 42 from the +5 volt DC electrical power supply. This leaves the +Vb electrical power on lead 42 to be supplied from battery 28 in processor power supply 14, from capacitor C22 or from battery 48 in switching network 20. Battery 28, supplying about 4.5 volts, in processor power supply 14 conducts electrical power over lead 30 as signal BPOW through schottky diode D1. Schottky diode D1 has a forward voltage drop of approximately 0.2-0.3 volts and prevents current from flowing back into battery 28 from the +Vb supply line 42.

Battery 48 connects between terminals BT1 and BT2 and supplies electrical current to the +Vb supply line 42 through resistor R2, jumper W2 and schottky diode D3. Battery 48 typically is a 3.6 volt lithium battery and can be otherwise as desired. Diode D3 has a small forward voltage drop when conducting power to the +Vb line 42 and prevents charging of the battery from the +Vb line. Resistor R2 prevents excessive current draw from the battery 48 upon short circuit of the +Vb supply line 42 to circuit ground.

Battery 28, capacitor 22 and battery 48 will supply electrical power to the +Vb line 42 according to the voltages available from each. Capacitor 22 will first supply power until its voltage decreases to that of one of the batteries. If the card assembly is connected to the central processor, the second battery 28 will next supply power. If the card assembly is standing free of the central processor, the back-up battery 48 will next supply power. In this way, the capacitor 22 acts to protect the battery 48 from supplying power and will substantially increase its life, which in turn will decrease the labor and other costs of replacing a dead battery.

Typically, battery 28 will be three D-cell batteries, and although these three sources are specified to supply electrical power for up to a year, under ideal conditions they can supply electrical power to the memory components for several years.

With the /PROTECT signal on line 46 going close to circuit ground, transistor Q1 becomes non-conductive between its source and drain to prevent any /MEMORY WRITE signal on line 38 from being conducted to the /RAMWR signal on line 44. This protects against extraneous noise causing an undesired WRITE to the dynamic memory components. The /RAMWR signal on line 44 connects through resistor RP1 and schottky diode D4 to the +Vb supply on line 42. Resistor RP1 pulls the signal /RAMWR to the level of the +Vb signal while schottky diode D4 clamps that signal to the +Vb supply.

This arrangement and construction of parts on the memory card 16 furnishes a smooth transition from loss of normal electrical power to a continuous and lengthy supply of electrical power from any of capacitor 22, battery 48 and battery 28.

Modifications and variations of this particular embodiment are possible while remaining within the scope of the appended claims. For example, the exact placement and selection of transistors, resistors, capacitors and diodes can be made to be different while retaining their function. PNP transistors might be substituted for NPN transistors with suitable selection of resistor values. Also, the placement, connection and voltages of batteries 28 and 48 can be as desired, and the capacity of capacitor 22 can be as desired while retaining its function.

I claim:

1. A switching network for a programmable controller carried on a removable card assembly including memory components that receive power on a power lead, said card assembly including a source lead adapted to be connected to a line source of electrical power that is subject to failure, said electrical power occurring at a certain voltage, said network transmitting electrical power to said power lead, said switching network comprising:
   a switch connected between said source lead and said power lead, said switch being normally closed to conduct electrical power from said source lead to said power lead and becoming open upon at least partial loss of said certain voltage of said line source electrical power;
   capacitance means having high capacity and normally receiving electrical charge at the voltage of said line source power supply from said source lead, and supplying electrical power to said power lead upon the voltage at said power lead falling below said certain voltage due to at least a temporary failure in said line source power supply; and
   first battery means having a first voltage substantially less than said certain voltage of said line source electrical power supply, said first battery means being connected to said power lead and supplying power to said power lead upon the voltage on said power lead falling substantially to said first voltage.

2. The circuit of claim 1 including second battery means having a second voltage between said certain voltage and said first voltage and connected to said power lead for supplying electrical power to said power lead upon the voltage on said power lead falling below said certain voltage to about said second voltage.

3. The circuit of claim 1 in which said capacitor and first battery means include blocking means to prevent power on said power lead from flowing back to said respective capacitor and first battery means.

4. The circuit of claim 3 in which said blocking means include diodes having low forward voltage drops.

5. The circuit of claim 1 in which said capacitor means include resistor means for limiting the flow of power to said capacitor means from said source lead.

6. A write line lockout circuit for a programmable controller preventing the writing of erroneous data into memory components upon occurrence of a failure of normal electrical power supply indicated by a FAIL signal, said circuit comprising:
   first switch means receiving said FAIL signal to produce a PROTECT signal; and
   second switch means in series with the MEMORY WRITE signal to prevent passage of said MEMORY WRITE signal to said dynamic memory components in response to said PROTECT signal.

7. A power fail lockout circuit for a programmable controller to protect dynamic memory components on a removable memory card assembly from being selected upon loss of normal electrical power or upon removal during service of the programmable controller said circuit comprising:
   first switch means normally producing said PROTECT signal in an inactive state, said first switch means having at least one intermediate stage and said first switch means producing said PROTECT signal in anactive state upon loss of said normal source of electrical power; and
   hysteresis means connected from the output of said first switch means to said intermediate stage to provide a hysteresis in the transitions between said active and in active states of said PROTECT signal.

8. A switching network for a programmable controller carried on a removable card assembly including memory components that receive power on a power lead, said card assembly including a source lead adapted to be connected to a line source of electrical power that is subject to failure, said electrical power occurring at a certain voltage, said network transmitting electrical power to said power lead, said switching network comprising:

capacitance means having high capacity and normally receiving electrical charge at the voltage of said line source power supply from said source lead, and supplying electrical power to said power lead upon the voltage at said power lead falling below said certain voltage due to at least a temporary failure in said line source power supply; and first battery means having a first voltage substantially less than said certain voltage of said line source electrical power supply, said first battery means being connected to said power lead and supplying power to said power lead upon the voltage on said power lead falling substantially to said first voltage.

* * * * *